United States Patent
Giaccio et al.

(10) Patent No.: US 11,309,055 B2
(45) Date of Patent: Apr. 19, 2022

(54) POWER LOSS TEST ENGINE DEVICE AND METHOD

(71) Applicant: Micron Technology, Inc., Boise, ID (US)

(72) Inventors: Claudio Giaccio, Torre del Greco (IT); Ferdinando Pascale, Ottaviano (IT); Raffaele Mastrangelo, S. Anastasia (IT); Erminio Di Martino, Quarto (IT); Ferdinando D'Alessandro, Nola (IT); Cristiano Castellano, Volturara Irpina (IT); Andrea Castaldo, Portici (IT)

(73) Assignee: Micron Technology, Inc., Boise, ID (US)

( * ) Notice: Subject to any disclaimer, the term of this patent is extended or adjusted under 35 U.S.C. 154(b) by 139 days.

(21) Appl. No.: 16/227,021

(22) Filed: Dec. 20, 2018

(65) Prior Publication Data

US 2020/0202971 A1    Jun. 25, 2020

(51) Int. Cl.
    *G11C 29/50*    (2006.01)
(52) U.S. Cl.
    CPC .................................... *G11C 29/50* (2013.01)
(58) Field of Classification Search
    None
    See application file for complete search history.

(56) References Cited

U.S. PATENT DOCUMENTS

| | | | | |
|---|---|---|---|---|
| 6,182,253 B1* | 1/2001 | Lawrence | ............... | G11C 29/50 365/201 |
| 9,639,131 B2* | 5/2017 | Miller | ..................... | G06F 1/263 |
| 10,008,288 B2* | 6/2018 | Lee | .......... | G11C 29/04 |
| 2005/0108491 A1* | 5/2005 | Wong | ............... | G11C 29/50004 711/167 |
| 2011/0276845 A1* | 11/2011 | Depew | ................... | G11C 29/50 714/718 |
| 2018/0158493 A1* | 6/2018 | Ryu | ..................... | G06F 11/1048 |

OTHER PUBLICATIONS

"Toshiba, Application Note UFS Memory Device, JEDEC UFS Ver.2.0" (Mar. 2014) (Year: 2014).*

* cited by examiner

*Primary Examiner* — Cynthia Britt
*Assistant Examiner* — Matthew W Wahlin
(74) *Attorney, Agent, or Firm* — Schwegman Lundberg & Woessner, P.A.

(57) ABSTRACT

Apparatus and methods are disclosed, including test systems for memory devices. Example test systems and methods include power loss logic to determine when one or more test conditions have been met in a memory operation between a host device and a memory device under test. Example test systems and methods include a function to then instruct a power management device to trigger a power loss event.

17 Claims, 6 Drawing Sheets

POWER LOSS TEST ENGINE DEVICE AND METHOD

BACKGROUND

Memory devices are semiconductor circuits that provide electronic storage of data for a host system (e.g., a computer or other electronic device). Memory devices may be volatile or non-volatile. Volatile memory requires power to maintain data, and includes devices such as random-access memory (RAM), static random-access memory (SRAM), dynamic random-access memory (DRAM), or synchronous dynamic random-access memory (SDRAM), among others. Non-volatile memory can retain stored data when not powered, and includes devices such as flash memory, read-only memory (ROM), electrically erasable programmable ROM (EPROM), erasable programmable ROM (EPROM), resistance variable memory, such as phase change random access memory (PCRAM), resistive random-access memory (RRAM), or magnetoresistive random access memory (MRAM), among others.

Host systems typically include a host processor, a first amount of main memory (e.g., often volatile memory, such as DRAM) to support the host processor, and one or more storage systems (e.g., often non-volatile memory, such as flash memory) that provide additional storage to retain data in addition to or separate from the main memory.

A storage system, such as a solid-state drive (SSD), can include a memory controller and one or more memory devices, including a number of dies or logical units (LUNs). In certain examples, each die can include a number of memory arrays and peripheral circuitry thereon, such as die logic or a die processor. The memory controller can include interface circuitry configured to communicate with a host device (e.g., the host processor or interface circuitry) through a communication interface (e.g., a bidirectional parallel or serial communication interface). The memory controller can receive commands or operations from the host system in association with memory operations or instructions, such as read or write operations to transfer data (e.g., user data and associated integrity data, such as error data or address data, etc.) between the memory devices and the host device, erase operations to erase data from the memory devices, perform drive management operations (e.g., data migration, garbage collection, block retirement), etc.

Maintaining data integrity in unexpected failures such as power loss is an important concern for memory systems, such as those described above. It is important to be able to robustly test the performance of memory devices in the event of unexpected failures such as power loss. Memory test systems and methods described below address testing concerns such as these.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Figure 1:
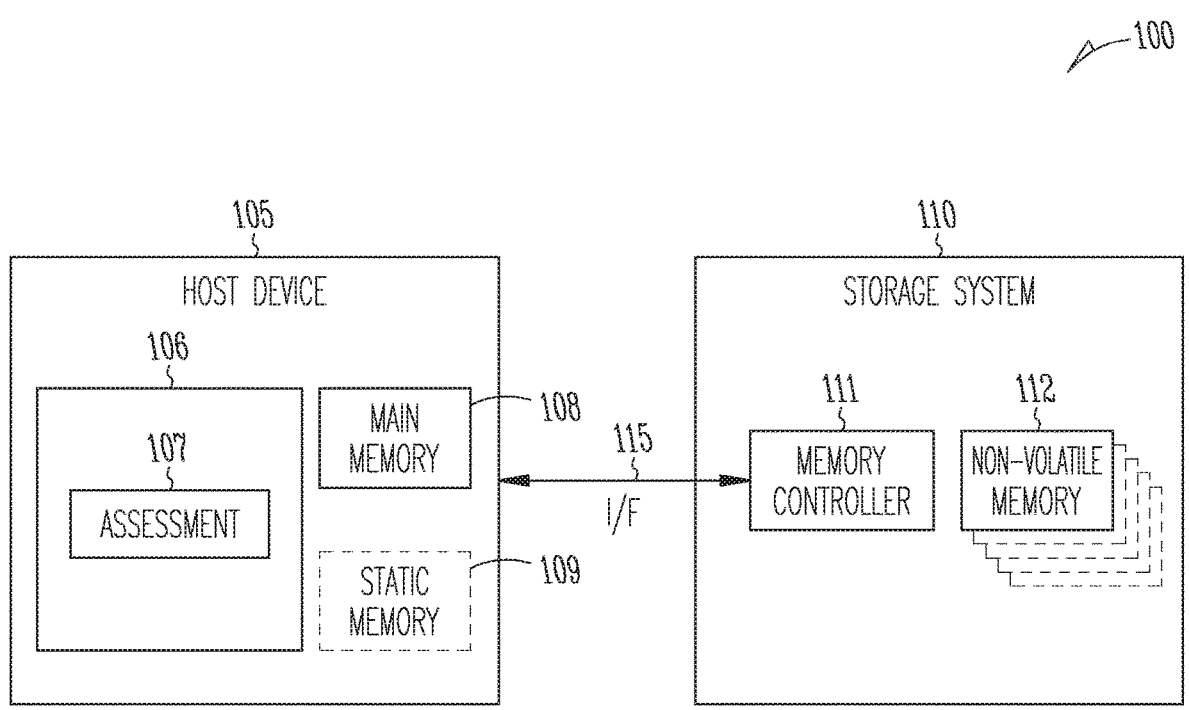
FIG. 1 illustrates an example host system including a host device and a storage system.

FIG. 1 illustrates an example system (e.g., a host system) 100 including a host device 105 and a storage system 110 configured to communicate over a communication interface (I/F) 115 (e.g., a bidirectional parallel or serial communication interface). The host device 105 can include a host processor 106 (e.g., a host central processing unit (CPU) or other processor or processing device) or other host circuitry (e.g., a memory management unit (MMU), interface circuitry, assessment circuitry 107, etc.). In certain examples, the host device 105 can include a main memory 108 (e.g., DRAM, etc.) and optionally, a static memory 109, to support operation of the host processor 106.

The storage system 110 can include a universal flash storage (UFS) device, an embedded MMC (eMMC™) device, or one or more other memory devices. For example, if the storage system 110 includes a UFS device, the communication interface 115 can include a serial bidirectional interface, such as defined in one or more Joint Electron Device Engineering Council (JEDEC) standards (e.g., JEDEC standard D223D (JESD223D), commonly referred to as JEDEC UFS Host Controller Interface (UFSHCI) 3.0, etc.). In another example, if the storage system 110 includes an eMMC device, the communication interface 115 can include a number of parallel bidirectional data lines (e.g., DAT[7:0]) and one or more command lines, such as defined in one or more JEDEC standards (e.g., JEDEC standard D84-B51 (JESD84-A51), commonly referred to as JEDEC eMMC standard 5.1, etc.). In other examples, the storage system 110 can include one or more other memory devices, or the communication interface 115 can include one or more other interfaces, depending on the host device 105 and the storage system 110.

The storage system 110 can include a memory controller 111 and a non-volatile memory 112. In an example, the non-volatile memory can include a number of memory devices (e.g., dies or LUNs), such as one or more flash memory devices, etc., each including periphery circuitry thereon, and controlled by the memory controller 111.

Flash memory devices typically include one or more groups of one-transistor, floating gate memory cells. Two common types of flash memory array architectures include NAND and NOR architectures. The floating gate memory cells of the memory array are typically arranged in a matrix. The gates of each memory cell in a row of the array are coupled to an access line (e.g., a word line). In NOR architecture, the drains of each memory cell in a column of the array are coupled to a data line (e.g., a bit line). In NAND architecture, the drains of each memory cell in a column of the array are coupled together in series, source to drain, between a source line and a bit line.

Each memory cell in a NOR, NAND, 3D Cross Point, Holographic RAM (HRAM), MRAM, or one or more other architecture semiconductor memory array can be programmed individually or collectively to one or a number of programmed states. A single-level cell (SLC) can represent one bit of data per cell in one of two programmed states (e.g., 1 or 0). A multi-level cell (MLC) can represent two or more bits of data per cell in a number of programmed states (e.g., $2^n$, where n is the number of bits of data). In certain examples, MLC can refer to a memory cell that can store two bits of data in one of 4 programmed states. A triple-level cell (TLC) can represent three bits of data per cell in one of 8 programmed states. A quad-level cell (QLC) can represent four bits of data per cell in one of 16 programmed states. Unless otherwise clearly indicated by express language or context, MLC is used herein in its broader context, to refer to memory cells that can store more than one bit of data per cell (i.e., that can represent more than two programmed states).

The storage system 110 can include a multimedia card (MMC) solid-state storage device (e.g., micro secure digital (SD) cards, etc.). MMC devices include a number of parallel interfaces (e.g., an 8-bit parallel interface) with a host device 105, and are often removable and separate components from the host device. In contrast, embedded MMC (eMMC) devices are attached to a circuit board and considered a component of the host device, with read speeds that rival serial ATA (SATA) based SSD devices. As demand for mobile device performance continues to increase, such as to fully enable virtual or augmented-reality devices, utilize increasing networks speeds, etc., storage systems have shifted from parallel to serial communication interfaces. UFS devices, including controllers and firmware, communicate with a host device using a low-voltage differential signaling (LVDS) serial interface with dedicated read/write paths, further advancing read/write speeds between a host device and a storage system.

In three-dimensional (3D) architecture semiconductor memory device technology, vertical floating gate or charge trapping storage structures can be stacked, increasing the number of tiers, physical pages, and accordingly, the density of memory cells in a memory device.

Data is often stored arbitrarily on the storage system as small units. Even if accessed as a single unit, data can be received in small, random 4-16 k single file reads (e.g., 60%-80% of operations are smaller than 16 k). It is difficult for a user and even kernel applications to indicate that data should be stored as one sequential cohesive unit. File systems are typically designed to optimize space usage, and not sequential retrieval space.

The memory controller 111 can receive instructions from the host device 105, and can communicate with the non-volatile memory 112, such as to transfer data to (e.g., write or erase) or from (e.g., read) one or more of the memory cells of the non-volatile memory array 112. The memory controller 111 can include, among other things, circuitry or firmware, such as a number of components or integrated circuits. For example, the memory controller 111 can include one or more memory control units, circuits, or components configured to control access across the memory array and to provide a translation layer between the host device 105 and the storage system 100.

The non-volatile memory array 112 (e.g., a 3D NAND architecture semiconductor memory array) can include a number of memory cells arranged in, for example, a number of devices, planes, blocks, or physical pages. As one example, a TLC memory device can include 18,592 bytes (B) of data per page, 1536 pages per block, 548 blocks per plane, and 4 planes per device. As another example, an MLC memory device can include 18,592 bytes (B) of data per page, 1024 pages per block, 548 blocks per plane, and 4 planes per device, but with half the required write time and twice the program/erase (P/E) cycles as a corresponding TLC memory device. Other examples can include other numbers or arrangements.

In operation, data is typically written to or read from the storage system 110 in pages and erased in blocks. However, one or more memory operations (e.g., read, write, erase, etc.) can be performed on larger or smaller groups of memory cells, as desired. For example, a partial update of tagged data from an offload unit can be collected during data migration or garbage collection to ensure it was re-written efficiently. The data transfer size of a memory device is typically referred to as a page, whereas the data transfer size of a host device is typically referred to as a sector. Although a page of data can include a number of bytes of user data (e.g., a data payload including a number of sectors of data) and its corresponding metadata, the size of the page often refers only to the number of bytes used to store the user data. As an example, a page of data having a page size of 4 KB may include 4 KB of user data (e.g., 8 sectors assuming a sector size of 512B) as well as a number of bytes (e.g., 32B, 54B, 224B, etc.) of metadata corresponding to the user data, such as integrity data (e.g., error detecting or correcting code data), address data (e.g., logical address data, etc.), or other metadata associated with the user data.

Different types of memory cells or memory arrays can provide for different page sizes, or may require different amounts of metadata associated therewith. For example, different memory device types may have different bit error rates, which can lead to different amounts of metadata necessary to ensure integrity of the page of data (e.g., a memory device with a higher bit error rate may require more bytes of error correction code data than a memory device with a lower bit error rate). As an example, an MLC NAND flash device may have a higher bit error rate than a corresponding SLC NAND flash device. As such, the MLC device may require more metadata bytes for error data than the corresponding SLC device.

Figure 2:
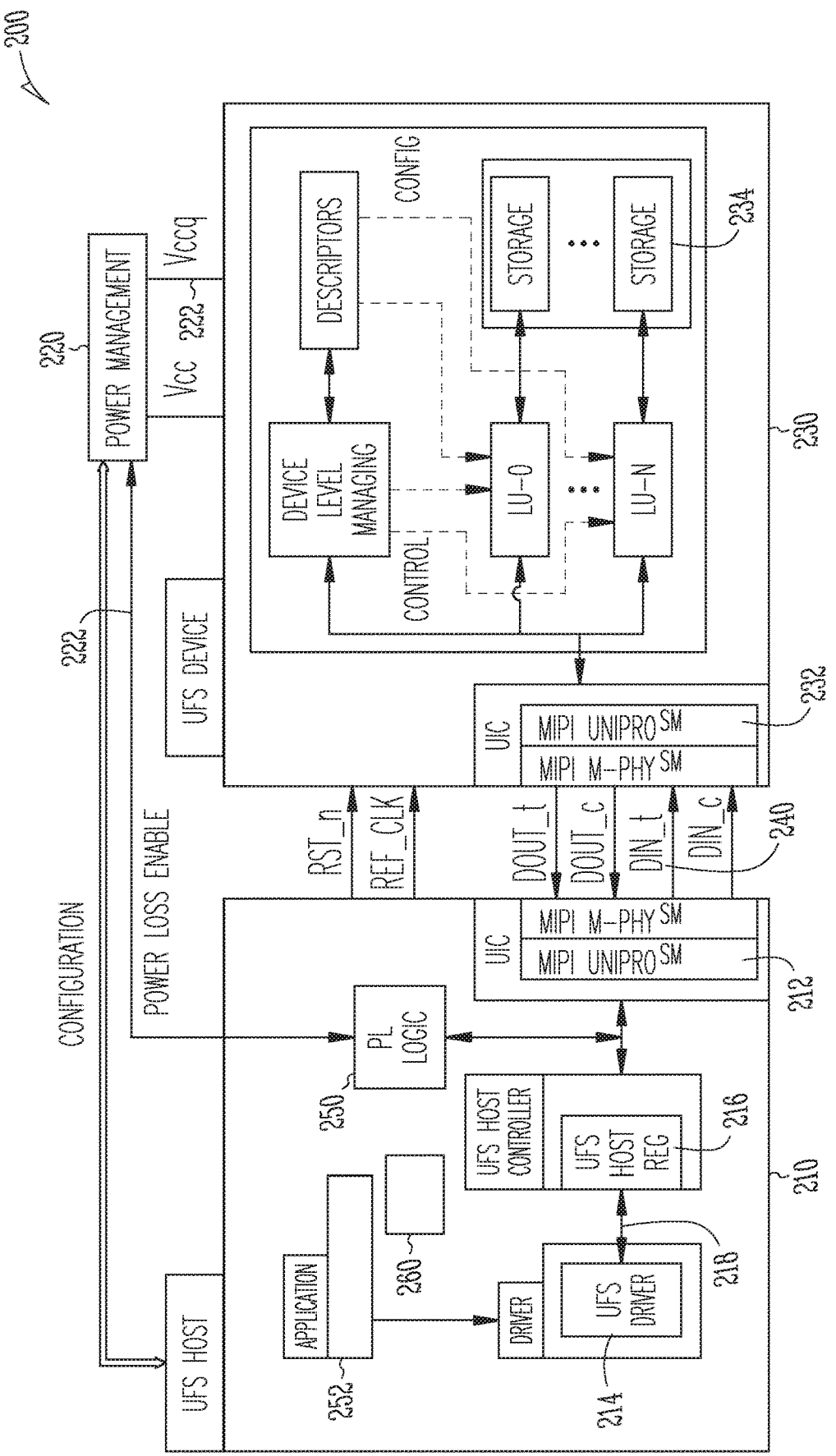
FIG. 2 illustrates a block diagram of a test system in accordance with some example embodiments.

As discussed above, it is desirable to rigorously test storage systems, including, but not limited to storage systems configured as system 110 described above. FIG. 2 illustrates a block diagram of a test system 200 according to one example. The test system 200 includes a host device 210, and a memory device under test 230. In one example, the memory device under test 230 includes one or more units of non-volatile memory 234. In one example, the memory device under test 230 includes a memory controller 232. A power management device 220 is shown coupled to both the host device 210 and the memory device under test 230.

In one example, the host device 210 includes a Unified Flash Specification (UFS) host, although the invention is not so limited. Other memory configurations including, but not limited to, eMMC, and solid state drives (SSD) are also within the scope of the invention.

In the example of FIG. 2, the host device 210 consists of an application 252 that is configured to communicate with the memory device under test 230. It communicates with the device 230 using a driver 214. The driver 214 is meant for managing a host controller 216 through a host controller interface (HCI). In one example, a UFS HCI is basically a set of registers exposed by the host controller 216. A host hardware interface 212 is further shown between the host device 210 and the memory device under test 230. In one example, the host hardware interface 212 includes a mobile industry processor interface (MIPI) and a unified protocol (UniPro) interface. Physical examples include a plurality of transmission and receiver pairs, FIG. 2 shows a block of power loss logic 250 contained in the host device 210. In the example of FIG. 2, the power loss logic 250 is shown in communication with an input and output pathway between the host controller 216 and the host hardware interface 212. The power loss logic 250 is further shown in communication with the power management device 220 through a power loss enable pathway 222. In this example, when one or more test conditions have been met in an exchange between the host device 210 and the memory device under test 230, the power loss logic 250 may trigger a power loss in the memory device under test 230 by sending an enable signal over pathway 222 to the power management device 220.

A more precise and rigorous test of a memory device's ability to withstand one or more power losses includes the ability to trigger a test power loss at a specific time during memory device operation and/or in response to a specific desired event for test. Using examples of test systems described in the present disclosure, several different types of memory processes can be specifically tested with a power loss during the memory process and at a specific desired time.

One example of a memory event that may be specifically tested with a targeted power loss includes a protocol event in transmission of a packet from the host device to the memory device under test. Another example of a memory event that may be specifically tested with a targeted power loss includes a protocol event in transmission of a packet from the memory device under test to the host device. Another example of a memory event that may be specifically tested with a targeted power loss includes a device management entity (DME) command. Another example of a memory event that may be specifically tested with a targeted power loss includes an externally triggered event that may be triggered at a specified time. Externally triggered events may be useful to test any event that is not under control of the host device. In one example, firmware in the memory device under test itself is used as source of the trigger signal. Power loss can be given to the memory device under test during a specific internal operation, regardless of what is happening in communication protocol operation.

FIG. 2 further shows a recording system 260 that may be used to log any number of device operations, such as protocol operations, DME operations, external trigger conditions, or other test conditions. In one example, the recording system 260 may be used to evaluate whether or not the desired test conditions occurred, and when. In this way, a user can evaluate whether a test protocol performed the desired test, and how the memory device under test performed. Although the recording device 260 is shown located within the host device 210, the invention is not so limited. For example, the recording device 260 may be external to the host device 210, and coupled to operate with a test protocol. In one example, the recording device 260 is integrated with the power loss logic 250.

Figure 3:
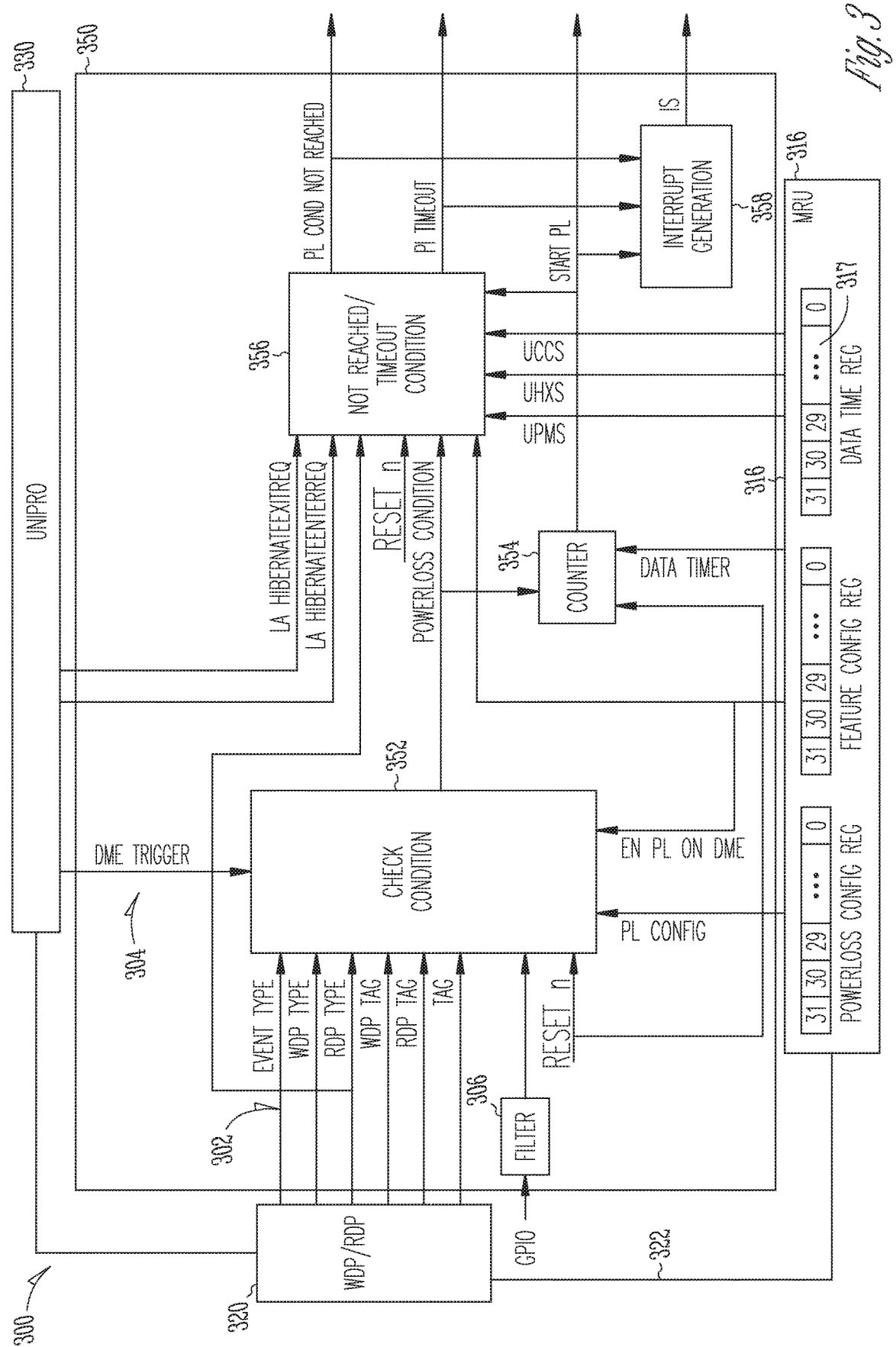
FIG. 3 illustrates another block diagram of some host's blocks in accordance with some example embodiments.

FIG. 3 shows a block diagram of the power loss logic block and its interaction with others blocks inside the host controller, similar to the power loss logic 250 from FIG. 2. The communication to and from a memory device passes through the Unipro layer of the host and the parameters of the communication protocol are interpreted by the write/read datapath host controller blocks 320. A read data path and write data path interface 320 is shown along the communication pathway 322. A check condition logic block 352 of the power loss logic 350, sends a message to an interrupt generator 358 when one or more test conditions as described below are met.

In the example of FIG. 3, a protocol input 302 connects to the interface 320, and is configured to provide inputs to the check condition logic block 352 of the power loss logic 350. Examples of protocol inputs include, but are not limited to, command UPIU (UFS Protocol Information Units), task management request UPIU, query request UPIU, data out UPIU, response UPIU, ready to transfer UPIU, and data in UPIU.

A DME input 304 is further shown connected between the Unipro layer of the host controller 330 and the ckeck condition logic block 352 of the power loss logic 350. Examples of DME inputs include, but are not limited to, DME get, DME peer get, DME set, DME peer set, DME reset, DME endpoint reset, DME link startup, DME hibernate enter, and DME hibernate exit.

An external trigger input 306 is also shown, configured to provide input to the check condition logic block 352. As noted above, external triggers are useful to specify a time or operation for a power loss event that does not involve communication between the memory device under test or the host device.

Other test conditions include a counter 354, and a timer 356. In operation, the counter 354 may be configured to count a number of times another test condition occurs. For example, after a protocol command has been used a selected number of times, the counter 354 is triggered if so programmed in the check condition logic block 352. A power loss event may then be triggered. Similarly, once a given test condition or conditions has occurred, the timer 356 may be configured to provide an input to the check condition logic block 352 for a selected amount of time delay before a power loss event is triggered.

Although a number of test conditions are described in this example, the invention is not so limited. Other test conditions apart from a communication protocol, DME command, external trigger, counter, and timer may be checked and used to trigger a test power loss event. In addition, although individual test conditions are described, in selected examples, combinations of two or more test conditions may be configured to be met before a power loss event is triggered.

In the example shown, the host device controller 316 is coupled to the check condition logic block 352, and may be used to program which one or more test conditions are to be satisfied in order to trigger a power loss event. In FIG. 3, the host device controller 316 includes one or more registers 317 that may be used to program a desired test condition into a check condition logic block 352. Although programming by registers is shown as an example the invention is not so limited.

Figure 4:
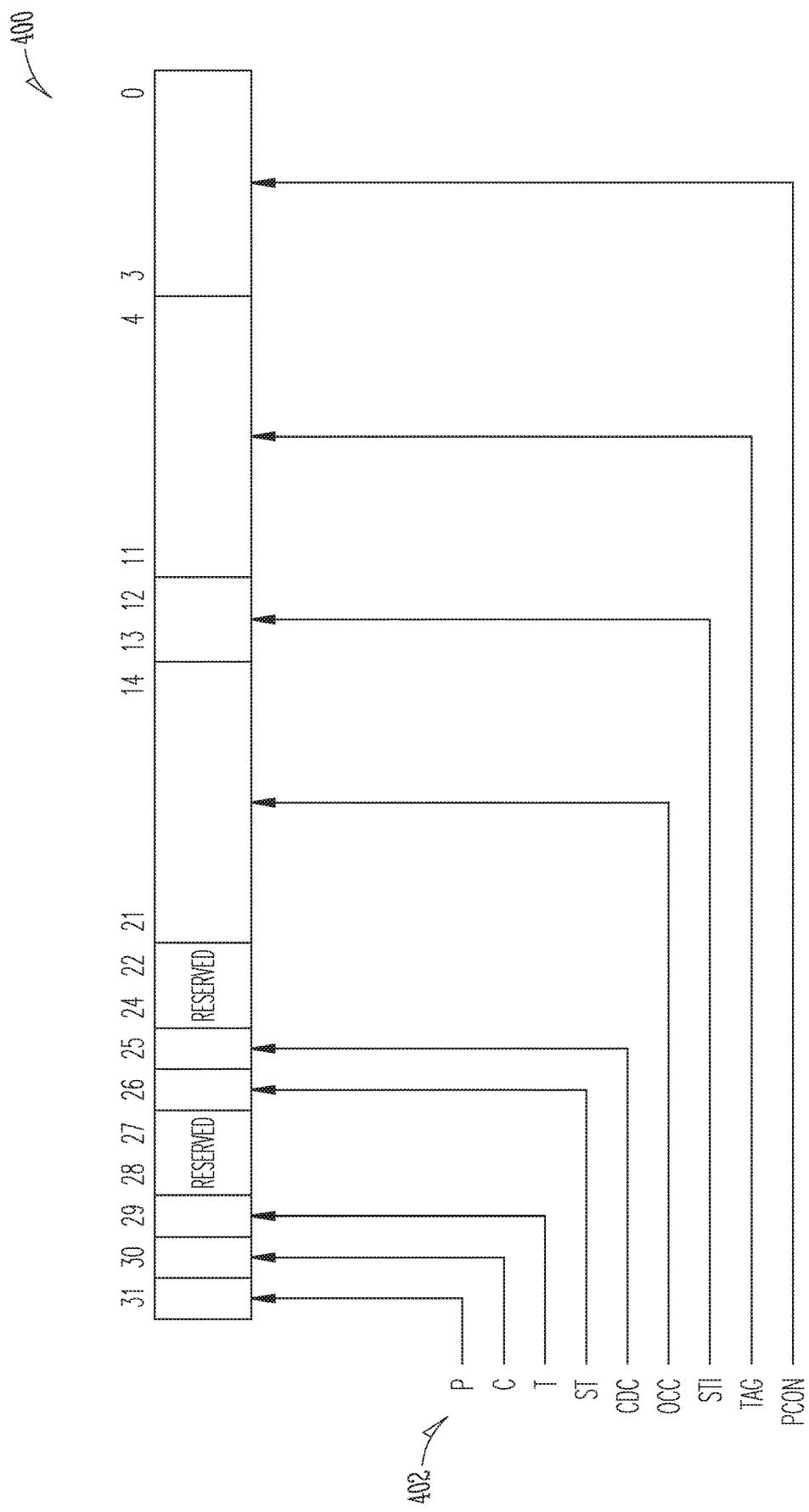
FIG. 4 illustrates a register diagram in accordance with some example embodiments.

FIG. 4 shows details of an example set of registers 400. Individual registers 402 in the example are labelled at the left side of the Figure, and example locations and bit sizes of the registers are illustrated.

In the example shown, "P" represents "Power loss condition detected and power loss signal enabled." In the example shown, "C" represents "Power loss condition not detected." In the example shown, "T" represent "Timeout" where the data timer exceeds a command life time. In the example shown, "ST" represents "Skip Timeout" which indicates that the test system will skip the timeout condition. In the example shown, "CDC" represents Check DME Command. In the example shown, "OCC" represents "Occurrence of a power loss condition." In the example shown, "STI" represents "Shift Timing." This register may coordinate with the timer 356 as shown in FIG. 3. In the example shown, "TAG" represents "Task Tag," such as CMD, TM, QR Tag. In the example shown, "PCON" represents "Powerloss Condition."

In one example, the register 400 may be used both to program the one or more test conditions into the power loss logic 350, and may also be used to send results of the test to a recording system, such as recording system 260 from FIG. 2.

Figure 5:
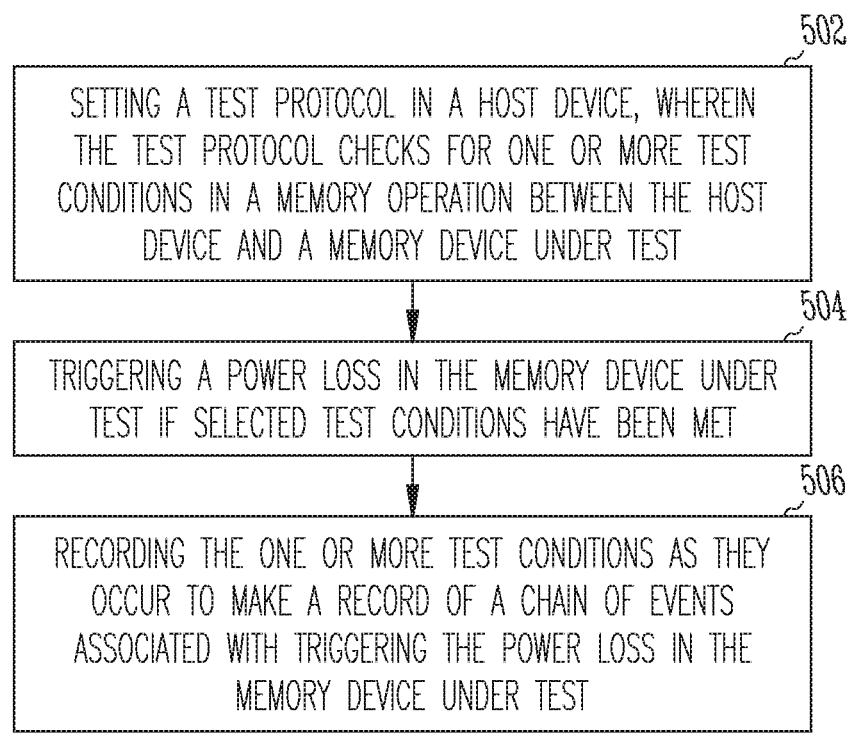
FIG. 5 illustrates an example method flow diagram in accordance with some example embodiments.

One example of a method of operation of test systems as described is shown in FIG. 5. In operation 502, a test protocol is set in a host device. As described in examples above, the test protocol checks for one or more test conditions in a memory operation between the host device and a memory device under test. In operation 504, a power loss is triggered in the memory device under test if selected test conditions have been met. In operation 506, the one or more test conditions are recorded as they occur to make a record of a chain of events associated with triggering the power loss in the memory device under test.

Figure 6:
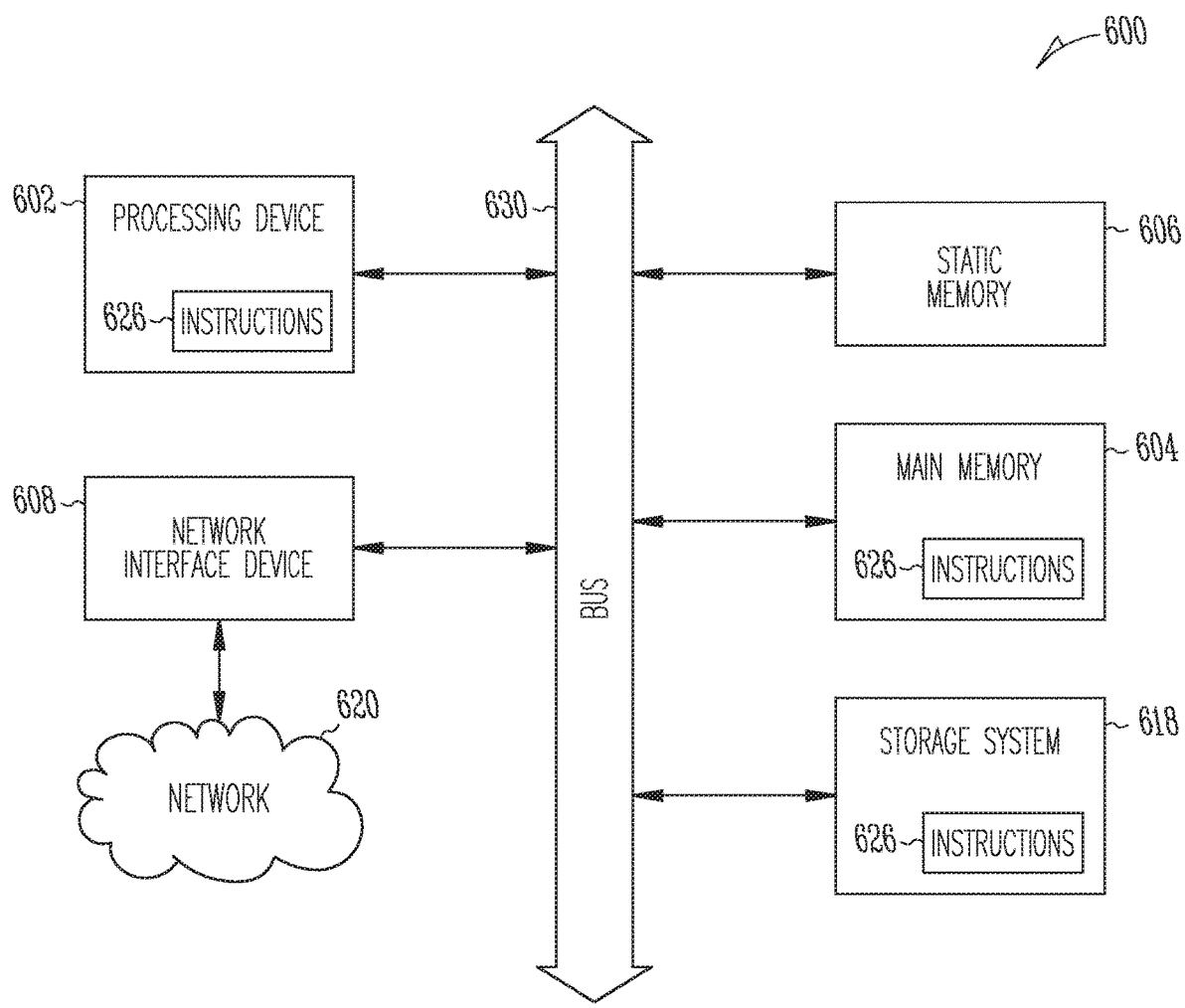
FIG. 6 illustrates an example block diagram of an information handling system in accordance with some example embodiments.

FIG. 6 illustrates a block diagram of an example machine (e.g., a host system) 600 upon which any one or more of the tests (e.g., methodologies) discussed herein may perform. In alternative embodiments, the machine 600 may operate as a standalone device or may be connected (e.g., networked) to other machines. In a networked deployment, the machine 600 may operate in the capacity of a server machine, a client machine, or both in server-client network environments. In an example, the machine 600 may act as a peer machine in peer-to-peer (P2P) (or other distributed) network environment. The machine 600 may be a personal computer (PC), a tablet PC, a set-top box (STB), a personal digital assistant (PDA), a mobile telephone, a web appliance, an IoT device, automotive system, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, may include, or may operate by, logic, components, devices, packages, or mechanisms. Circuitry is a collection (e.g., set) of circuits implemented in tangible entities that include hardware (e.g., simple circuits, gates, logic, etc.). Circuitry membership may be flexible over time and underlying hardware variability. Circuitries include members that may, alone or in combination, perform specific tasks when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a computer-readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable participating hardware (e.g., the execution units or a loading mechanism) to create members of the circuitry in hardware via the variable connections to carry out portions of the specific tasks when in operation. Accordingly, the computer-readable medium is communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry at a different time.

The machine (e.g., computer system, a host system, etc.) 600 may include a processing device 602 (e.g., a hardware processor, a central processing unit (CPU), a graphics processing unit (GPU), a hardware processor core, or any combination thereof, etc.), a main memory 604 (e.g., read-only memory (ROM), dynamic random-access memory (DRAM) such as synchronous DRAM (SDRAM) or Rambus DRAM (RDRAM), etc.), a static memory 606 (e.g., static random-access memory (SRAM), etc.), and a storage system 618, some or all of which may communicate with each other via a communication interface (e.g., a bus) 630.

The processing device 602 can represent one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 602 can also be one or more special-purpose processing devices such as an application specific integrated circuit (ASIC), a field programmable gate array (FPGA), a digital signal processor (DSP), network processor, or the like. The processing device 602 can be configured to execute instructions 626 for performing the operations and steps discussed herein. The computer system 600 can further include a network interface device 608 to communicate over a network 620.

The storage system 618 can include a machine-readable storage medium (also known as a computer-readable medium) on which is stored one or more sets of instructions 626 or software embodying any one or more of the methodologies or functions described herein. The instructions 626 can also reside, completely or at least partially, within the main memory 604 or within the processing device 602 during execution thereof by the computer system 600, the main memory 604 and the processing device 602 also constituting machine-readable storage media.

The term "machine-readable storage medium" should be taken to include a single medium or multiple media that store the one or more sets of instructions, or any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media. In an example, a massed machine-readable medium comprises a machine-readable medium with a plurality of particles having invariant (e.g., rest) mass. Accordingly, massed machine-readable media are not transitory propagating signals. Specific examples of massed machine-readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The machine 600 may further include a display unit, an alphanumeric input device (e.g., a keyboard), and a user interface (UI) navigation device (e.g., a mouse). In an example, one or more of the display unit, the input device, or the UI navigation device may be a touch screen display. The machine a signal generation device (e.g., a speaker), or one or more sensors, such as a global positioning system (GPS) sensor, compass, accelerometer, or one or more other sensor. The machine 600 may include an output controller, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The instructions 626 (e.g., software, programs, an operating system (OS), etc.) or other data are stored on the storage system 618 can be accessed by the main memory 604 for use by the processing device 602. The main memory 604 (e.g., DRAM) is typically fast, but volatile, and thus a different type of storage than the storage system 618 (e.g., an SSD), which is suitable for long-term storage, including while in an "off" condition. The instructions 626 or data in use by a user or the machine 600 are typically loaded in the main memory 604 for use by the processing device 602. When the main memory 604 is full, virtual space from the storage system 618 can be allocated to supplement the main memory 604; however, because the storage system 618 device is typically slower than the main memory 604, and write speeds are typically at least twice as slow as read speeds, use of virtual memory can greatly reduce user experience due to storage system latency (in contrast to the main memory 604, e.g., DRAM). Further, use of the storage system 618 for virtual memory can greatly reduce the usable lifespan of the storage system 618.

The instructions 624 may further be transmitted or received over a network 620 using a transmission medium via the network interface device 608 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, peer-to-peer (P2P) networks, among others. In an example, the network interface device 608 may include one or more physical jacks (e.g., Ethernet, coaxial, or phone jacks) or one or more antennas to connect to the network 620. In an example, the network interface device 608 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding, or carrying instructions for execution by the machine 600, and includes digital or analog communications signals or other intangible medium to facilitate communication of such software.

The above detailed description includes references to the accompanying drawings, which form a part of the detailed description. The drawings show, by way of illustration, specific embodiments in which the invention can be practiced. These embodiments are also referred to herein as "examples". Such examples can include elements in addition to those shown or described. However, the present inventor also contemplates examples in which only those elements shown or described are provided. Moreover, the present inventor also contemplates examples using any combination or permutation of those elements shown or described (or one or more aspects thereof), either with respect to a particular example (or one or more aspects thereof), or with respect to other examples (or one or more aspects thereof) shown or described herein.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein". Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

In various examples, the components, controllers, processors, units, engines, or tables described herein can include, among other things, physical circuitry or firmware stored on a physical device. As used herein, "processor" means any type of computational circuit such as, but not limited to, a microprocessor, a microcontroller, a graphics processor, a digital signal processor (DSP), or any other type of processor or processing circuit, including a group of processors or multi-core devices.

The term "horizontal" as used in this document is defined as a plane parallel to the conventional plane or surface of a substrate, such as that underlying a wafer or die, regardless of the actual orientation of the substrate at any point in time. The term "vertical" refers to a direction perpendicular to the horizontal as defined above. Prepositions, such as "on," "over," and "under" are defined with respect to the conventional plane or surface being on the top or exposed surface of the substrate, regardless of the orientation of the substrate; and while "on" is intended to suggest a direct contact of one structure relative to another structure which it lies "on" (in the absence of an express indication to the contrary); the terms "over" and "under" are expressly intended to identify a relative placement of structures (or layers, features, etc.), which expressly includes—but is not limited to—direct contact between the identified structures unless specifically identified as such. Similarly, the terms "over" and "under"

are not limited to horizontal orientations, as a structure may be "over" a referenced structure if it is, at some point in time, an outermost portion of the construction under discussion, even if such structure extends vertically relative to the referenced structure, rather than in a horizontal orientation.

The terms "wafer" and "substrate" are used herein to refer generally to any structure on which integrated circuits are formed, and also to such structures during various stages of integrated circuit fabrication. The following detailed description is, therefore, not to be taken in a limiting sense, and the scope of the various embodiments is defined only by the appended claims, along with the full scope of equivalents to which such claims are entitled.

Various embodiments according to the present disclosure and described herein include memory utilizing a vertical structure of memory cells (e.g., NAND strings of memory cells). As used herein, directional adjectives will be taken relative a surface of a substrate upon which the memory cells are formed (i.e., a vertical structure will be taken as extending away from the substrate surface, a bottom end of the vertical structure will be taken as the end nearest the substrate surface and a top end of the vertical structure will be taken as the end farthest from the substrate surface).

As used herein, directional adjectives, such as horizontal, vertical, normal, parallel, perpendicular, etc., can refer to relative orientations, and are not intended to require strict adherence to specific geometric properties, unless otherwise noted. For example, as used herein, a vertical structure need not be strictly perpendicular to a surface of a substrate, but may instead be generally perpendicular to the surface of the substrate, and may form an acute angle with the surface of the substrate (e.g., between 60 and 120 degrees, etc.).

In some embodiments described herein, different doping configurations may be applied to a select gate source (SGS), a control gate (CG), and a select gate drain (SGD), each of which, in this example, may be formed of or at least include polysilicon, with the result such that these tiers (e.g., polysilicon, etc.) may have different etch rates when exposed to an etching solution. For example, in a process of forming a monolithic pillar in a 3D semiconductor device, the SGS and the CG may form recesses, while the SGD may remain less recessed or even not recessed. These doping configurations may thus enable selective etching into the distinct tiers (e.g., SGS, CG, and SGD) in the 3D semiconductor device by using an etching solution (e.g., tetramethylammonium hydroxide (TMCH)).

Operating a memory cell, as used herein, includes reading from, writing to, or erasing the memory cell. The operation of placing a memory cell in an intended state is referred to herein as "programming," and can include both writing to or erasing from the memory cell (i.e., the memory cell may be programmed to an erased state).

According to one or more embodiments of the present disclosure, a memory controller (e.g., a processor, controller, firmware, etc.) located internal or external to a memory device, is capable of determining (e.g., selecting, setting, adjusting, computing, changing, clearing, communicating, adapting, deriving, defining, utilizing, modifying, applying, etc.) a quantity of wear cycles, or a wear state (e.g., recording wear cycles, counting operations of the memory device as they occur, tracking the operations of the memory device it initiates, evaluating the memory device characteristics corresponding to a wear state, etc.)

According to one or more embodiments of the present disclosure, a memory access device may be configured to provide wear cycle information to the memory device with each memory operation. The memory device control circuitry (e.g., control logic) may be programmed to compensate for memory device performance changes corresponding to the wear cycle information. The memory device may receive the wear cycle information and determine one or more operating parameters (e.g., a value, characteristic) in response to the wear cycle information.

It will be understood that when an element is referred to as being "on," "connected to" or "coupled with" another element, it can be directly on, connected, or coupled with the other element or intervening elements may be present. In contrast, when an element is referred to as being "directly on," "directly connected to" or "directly coupled with" another element, there are no intervening elements or layers present. If two elements are shown in the drawings with a line connecting them, the two elements can be either be coupled, or directly coupled, unless otherwise indicated.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMS), read only memories (ROMs), and the like.

To better illustrate the method and apparatuses disclosed herein, a non-limiting list of embodiments is provided here:

Example 1 is a test system, including a power management device configured to selectively trigger a power loss event in a memory device under test, a host device, including a host driver, wherein the host device is coupled to the power management device, and power loss logic in the host device to determine when one or more test conditions have been met in a memory operation between the host device and the memory device under test, and instruct the power management device to trigger the power loss event as determined by the one or more test conditions.

In Example 2, the subject matter of Example 1 is optionally configured such that the memory device is a Unified Flash Specification (UFS) memory device.

In Example 3, the subject matter of any of Examples 1-2 is optionally configured such that the subject matter further includes a recording system to track the one or more test conditions in the memory operation and to record whether or not a power loss event was triggered.

In Example 4, the subject matter of any of Examples 1-3 is optionally configured such that the test conditions in the power loss logic include recognition of a protocol event in transmission of a packet from the host device to the memory device under test.

In Example 5, the subject matter of any of Examples 1-4 is optionally configured such that the test conditions in the power loss logic include recognition of a protocol event in transmission of a packet from the memory device under test to the host device.

In Example 6, the subject matter of any of Examples 1-5 is optionally configured such that the test conditions in the power loss logic include recognition of a device management entity (DME) command.

In Example 7, the subject matter of any of Examples 1-6 is optionally configured such that the test conditions in the power loss logic include recognition of an external trigger for power loss.

In Example 8, the subject matter of any of Examples 1-7 is optionally configured such that the external trigger comes from the memory device under test.

In Example 9, the subject matter of any of Examples 1-8 is optionally configured such that the test conditions in the power loss logic include monitoring a counter of one or more events before trigger of the power loss event.

In Example 10, the subject matter of any of Examples 1-9 is optionally configured such that the test conditions in the power loss logic include monitoring a timer before trigger of the power loss event.

Example 11 is a test system, including a power management device configured to selectively trigger a power loss event in a memory device under test, a host device, including a host driver, wherein the host device is coupled to the power management device, power loss logic in the host device to determine when one or more test conditions have been met in a memory operation between the host device and the memory device under test, and instruct the power management device to trigger the power loss event as determined by the one or more test conditions, and a number of registers in the host device to track the one or more test conditions in the memory operation and whether or not a power loss event was triggered.

In Example 12, the subject matter of Example 11 is optionally configured such that the registers include one or more registers chosen from a feature configuration register, a timer register, and a power loss register.

In Example 13, the subject matter of any of Examples 11-12 is optionally configured such that the memory device is a Unified Flash Specification (UFS) memory device.

Example 14 is a method of testing a memory device, including setting a test protocol in a host device, wherein the test protocol checks for one or more test conditions in a memory operation between the host device and a memory device under test, triggering a power loss in the memory device under test if selected test conditions have been met, and recording the one or more test conditions as they occur to make a record of a chain of events associated with triggering the power loss in the memory device under test.

In Example 15, the subject matter of Example 14 is optionally configured such that recording the one or more test conditions includes recording in one or more registers located in the host device.

In Example 16, the subject matter of any of Examples 14-15 is optionally configured such that triggering a power loss in the memory device under test includes triggering a power loss in a Unified Flash Specification (UFS) memory device.

In Example 17, the subject matter of any of Examples 14-16 is optionally configured such that triggering a power loss in the memory device under test includes monitoring a counter of one or more events before trigger of the power loss event.

In Example 18, the subject matter of any of Examples 14-17 is optionally configured such that triggering a power loss in the memory device under test includes monitoring a timer before trigger of the power loss event.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A test system, comprising:
a power management device configured to selectively trigger a power loss event in a memory device under test;
a host device, including a host driver, wherein the host device is coupled to the power management device; and
power loss logic in the host device to determine when one or more test conditions have been met in a memory operation between the host device and the memory device under test, and instruct the power management device to trigger the power loss event as determined by the one or more test conditions, wherein the test conditions in the power loss logic include recognition of an external trigger to cause the power management device to initiate a power loss to the memory device under test, the external trigger originating outside the power loss logic.

2. The test system of claim 1, wherein the memory device is a Unified Flash Specification (UFS) memory device.

3. The test system of claim 1, further including a recording system to track the one or more test conditions in the memory operation and to record whether or not a power loss event was triggered.

4. The test system of claim 1, wherein the test conditions in the power loss logic include recognition of a protocol event in transmission of a packet from the host device to the memory device under test.

5. The test system of claim 1, wherein the test conditions in the power loss logic include recognition of a protocol event in transmission of a packet from the memory device under test to the host device.

6. The test system of claim 1, wherein the test conditions in the power loss logic include recognition of a device management entity (DME) command.

7. The test system of claim 1, wherein the external trigger comes from the memory device under test.

8. The test system of claim 1, wherein the test conditions in the power loss logic include monitoring a counter of one or more events before trigger of the power loss event.

9. The test system of claim 1, wherein the test conditions in the power loss logic include monitoring a timer before trigger of the power loss event.

10. A test system, comprising:
a power management device configured to selectively trigger a power loss event in a memory device under test;

a host device, including a host driver, wherein the host device is coupled to the power management device;
power loss logic in the host device to determine when one or more test conditions have been met in a memory operation between the host device and the memory device under test, and instruct the power management device to trigger the power loss event as determined by the one or more test conditions, wherein the test conditions in the power loss logic include recognition of an external trigger to cause the power management device to initiate a power loss to the memory device under test, the external trigger originating outside the power loss logic; and a number of registers in the host device to track the one or more test conditions in the memory operation and whether or not a power loss event was triggered.

11. The test system of claim 10, wherein the registers include one or more registers chosen from a feature configuration register, a timer register, and a power loss register.

12. The test system of claim 10, wherein the memory device is a Unified Flash Specification (UFS) memory device.

13. A method of testing a memory device, comprising:
setting a test protocol in a host device, wherein the test protocol checks for one or more test conditions in a memory operation between the host device and a memory device under test;
triggering a power loss in the memory device under test if selected test conditions have been met, wherein the test conditions in the power loss logic include recognition of an external trigger to cause the power management device to initiate a power loss to the memory device under test, the external trigger originating outside the power loss logic; and
recording the one or more test conditions as they occur to make a record of a chain of events associated with triggering the power loss in the memory device under test.

14. The method of claim 13, wherein recording the one or more test conditions includes recording in one or more registers located in the host device.

15. The method of claim 13, wherein triggering a power loss in the memory device under test includes triggering a power loss in a Unified Flash Specification (UFS) memory device.

16. The method of claim 13, wherein triggering a power loss in the memory device under test, includes monitoring a counter of one or more events before trigger of the power loss event.

17. The method of claim 13, wherein triggering a power loss in the memory device under test includes monitoring a timer before trigger of the power loss event.

* * * * *